United States Patent
Nishide et al.

(10) Patent No.: US 11,302,666 B2
(45) Date of Patent: Apr. 12, 2022

(54) MOUNTING HEAD

(71) Applicant: SHINKAWA LTD., Tokyo (JP)

(72) Inventors: Manato Nishide, Tokyo (JP); Kohei Seyama, Tokyo (JP); Hijiri Hayashi, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 399 days.

(21) Appl. No.: 16/464,276

(22) PCT Filed: Nov. 17, 2017

(86) PCT No.: PCT/JP2017/041484
§ 371 (c)(1),
(2) Date: Oct. 21, 2019

(87) PCT Pub. No.: WO2018/092883
PCT Pub. Date: May 24, 2018

(65) Prior Publication Data
US 2020/0051947 A1    Feb. 13, 2020

(30) Foreign Application Priority Data
Nov. 17, 2016    (JP) .............................. JP2016-224261

(51) Int. Cl.
 *H01L 23/00* (2006.01)
 *B23K 1/00* (2006.01)
 *B23K 3/08* (2006.01)

(52) U.S. Cl.
 CPC ............ *H01L 24/75* (2013.01); *B23K 1/0016* (2013.01); *B23K 3/087* (2013.01);
(Continued)

(58) Field of Classification Search
None
See application file for complete search history.

(56) References Cited

U.S. PATENT DOCUMENTS

| | | | | |
|---|---|---|---|---|
| 4,659,004 A | * | 4/1987 | Fridman ................ | B23K 1/012 228/49.1 |
| 5,419,481 A | * | 5/1995 | Lasto ..................... | B23K 1/012 228/6.2 |

(Continued)

FOREIGN PATENT DOCUMENTS

| | | |
|---|---|---|
| CN | 106102340 | 11/2016 |
| JP | 2003289088 | 10/2003 |

(Continued)

OTHER PUBLICATIONS

"Office Action of China Counterpart Application", dated Apr. 22, 2020, with English translation thereof, pp. 1-10.

(Continued)

*Primary Examiner* — Devang R Patel
(74) *Attorney, Agent, or Firm* — JCIPRNET

(57) ABSTRACT

A mounting apparatus is equipped with: an attachment including a surface for attaching a semiconductor die; a heater which is disposed on a side of the attachment opposite to the surface and heats the semiconductor die attached to the surface; a suction hole which penetrates through the attachment and the heater integrally and opens in the surface; and a body portion which is disposed on a side of the heater opposite to the attachment and on which a vacuum suction path in communication with the suction hole is arranged. The vacuum suction path includes a storage portion which stores a foreign matter consisting of a liquid formed by condensation of a gas suctioned from the suction hole or a solid formed by solidification of the liquid.

12 Claims, 13 Drawing Sheets

(52) U.S. Cl.
CPC .................. *H01L 2224/751* (2013.01); *H01L 2224/75252* (2013.01); *H01L 2224/75745* (2013.01)

(56) References Cited

U.S. PATENT DOCUMENTS

| | | | | |
|---|---|---|---|---|
| 5,553,768 | A | * | 9/1996 | Lasto ..................... B23K 1/012 |
| | | | | 228/102 |
| 5,785,237 | A | * | 7/1998 | Lasto ..................... B23K 1/012 |
| | | | | 228/180.22 |
| 6,016,949 | A | * | 1/2000 | Slesinger ........... B23K 37/0435 |
| | | | | 228/180.22 |
| 7,555,832 | B2 | * | 7/2009 | Guth ................. H01L 21/67005 |
| | | | | 29/739 |
| 8,670,651 | B2 | | 3/2014 | Yamazaki et al. |
| 2002/0092595 | A1 | * | 7/2002 | Fogal ................ H01L 21/67259 |
| | | | | 156/64 |
| 2014/0001162 | A1 | * | 1/2014 | Tanaka ................. B23K 26/352 |
| | | | | 219/121.6 |

FOREIGN PATENT DOCUMENTS

| | | |
|---|---|---|
| JP | 2008124382 | 5/2008 |
| JP | 2011086699 | 4/2011 |
| JP | 2012165313 | 8/2012 |
| WO | 2012165313 | 12/2012 |

OTHER PUBLICATIONS

"International Search Report (Form PCT/ISA/210)" of PCT/JP2017/041484, dated Feb. 6, 2018, with English translation thereof, pp. 1-2.

* cited by examiner

MOUNTING HEAD

CROSS-REFERENCE TO RELATED APPLICATION

This application is a 371 application of the International PCT application serial no. PCT/JP2017/041484, filed on Nov. 17, 2017, which claims the priority benefit of Japan Patent Application No. 2016-224261, filed on Nov. 17, 2016. The entirety of each of the above-mentioned patent applications is hereby incorporated by reference herein and made a part of this specification.

BACKGROUND OF THE INVENTION

Technical Field

The present invention relates to a mounting head which is used in an electronic component mounting apparatus that bonds electrodes of a semiconductor die and a substrate or electrodes of another semiconductor die.

Related Art

Conventionally, a method is widely used in which a semiconductor die attached in vacuum to an attachment is heated by a heat tool and is pressed onto a substrate applied with a thermoset resin to mount the semiconductor die on the substrate. When the thermoset resin is heated, volatile components gasify, and the gasified volatile components condense to a liquid or solidify to a solid when cooled. Therefore, there is a case that the volatile components of the thermoset resin gasified by heating are suctioned into a vacuum path from a narrow gap between the heat tool and the attachment or a narrow gap between the attachment and the semiconductor die, and condense or solidify inside a transfer valve to occur malfunction of a vacuum suction, or solidify in the gap between the heat tool and the attachment to cause poor heating of the semiconductor die. Therefore, a method is proposed, in which a cover is used to cover around the heat tool and the attachment, and air being blew out from the cover and the gasified volatile components being suctioned into the narrow gap between the heat tool and the attachment or into a vacuum suction hole is prevented (see patent literature 1).

LITERATURE OF RELATED ART

Patent Literature

Patent literature 1: National Publication of International Patent Application No. 2012-165313

SUMMARY

Problems to be Solved

Meanwhile, in recent years, a stack mounting for laminating and bonding, in a plurality of stages, a semiconductor die which is equipped with protruding electrodes on two surfaces is widely performed. In this stack mounting, after a solder bump is formed on a protruding electrode on the side to be bonded and a non-conductive film (NCF) is pasted on a surface of the solder bump, the semiconductor die is inverted, and a surface on the opposite side is attached to an attachment. After that, when the bump of the semiconductor die is pushed to the electrode of another semiconductor die by the attachment, and a temperature of the attachment is increased to a melting temperature (about 250° C.) of the solder, the NCF is low in viscosity and fills the gap of the semiconductor die. After that, the solder melts and resin curing progresses. Then, when the attachment is raised, the solder is reduced in temperature and solidifies, and the stack mounting of the semiconductor dies ends.

In the semiconductor die subjected to stack mounting, the protruding electrode is also formed on the surface attached to the attachment, and thus a gap corresponding to merely a height of the protruding electrode appears between the surface of the attachment and the surface of the semiconductor die when the semiconductor die is attached in vacuum to a leading end of the attachment. Components low in molecular weight such as acrylic monomers gasify when the NCF is heated to 200° C. or higher, and thus the gasified components of the NCF are suctioned from this gap into a vacuum suction hole inside the attachment when the attachment temperature is increased to a melting temperature of the solder (about 250° C.).

Here, in the above stack mounting, when the semiconductor die is picked up, it is necessary that the attachment is cooled until the temperature thereof is about 100° C. for example, so that the NCF is prevented from being low in viscosity. In addition, the pressure of the vacuum suction hole is in vacuum when the semiconductor die is attached, but after the bonding of the semiconductor die, it is necessary to stop the vacuum so as to remove the semiconductor die from the attachment. Therefore, when the attachment is heated to about 250° C. when the semiconductor die is attached and the electrodes are bonded, the gasified components of the NCF are suctioned in the form of gas into the vacuum suction hole arranged inside the attachment. After that, a process is repeated in which the suctioned gasified components remain in the vacuum suction hole when the suction is stopped, and the gasified components remaining inside condense to a liquid when the attachment is cooled to about 100° C. Then, a large amount of liquid containing the gasified components, which remains in the vacuum suction hole, is cured by being heated during a new stack processing of the semiconductor die and the like for example, resin containing the gasified components is generated, and the resin is accumulated in the vacuum suction hole. Finally, there is a problem that the accumulated resin seals the vacuum suction hole, and the mounting head or the like is fouled.

The present invention is accomplished based on the above conditions, and one of the aims is to inhibit fouling of a mounting head.

Means to Solve Problems

The mounting head of one aspect of the present invention, which is used in an electronic component mounting apparatus that bonds electrodes of a semiconductor die and a substrate or electrodes of another semiconductor die, includes: an attachment, which has an attachment surface for attaching a semiconductor die; a bonding heater, which is disposed on a surface of the attachment opposite to the attachment surface and heats the attachment and the semiconductor die; a body portion, which holds the bonding heater on an end surface; a first opening portion, which is formed on the attachment surface of the attachment; a second opening portion, which is formed on a surface different from the end surface of the body portion; a suction path, which has a first bending portion for bending a flowing path of gas suctioned from the first opening portion in the body portion and penetrates through the inside of the attachment, the bonding heater, and the body portion, and which discharges the gas suctioned from the first opening portion to the outside in the second opening portion; and a dripping prevention portion, which is formed in the suction path and inhibits droplets formed by condensation of the gas from dripping to the bonding heater.

In the mounting head, the dripping prevention portion may include a storage portion, which is disposed on a downstream side of the first bending portion in the suction path in a suction direction of the gas and stores the droplets formed by condensation of the gas or a solid formed by solidification of the droplets.

In the mounting head, the dripping prevention portion may include a path heater, which is disposed directly above a penetration hole penetrating through the bonding heater in the suction path and heats the gas to a temperature higher than a condensation temperature of the gas.

In the mounting head, the dripping prevention portion may include a cooling portion, which is disposed on the downstream side of the first bending portion in the suction path in the suction direction of the gas and cools the gas to a temperature lower than the condensation temperature of the gas.

In the mounting head, the dripping prevention portion may include a condensation portion, which is disposed on the downstream side of the first bending portion in the suction path in the suction direction of the gas and increases fluid resistance of the gas.

In the mounting head, the suction path may further include a second bending portion, which is arranged on the downstream side of the first bending portion in the suction direction of the gas, and the dripping prevention portion may be arranged over the first bending portion and the second bending portion.

In the mounting head, the storage portion which stores the droplets formed by condensation of the gas or the solid formed by solidification of the droplets may be disposed in the second bending portion.

In the mounting head, the body portion may be configured to be divisible into upper and lower in a division face passing through the storage portion which stores the droplets formed by condensation of the gas or the solid formed by solidification of the droplets.

In the mounting head, a bottom of the storage portion may be arranged in a lower body portion which is formed by division of the division face.

In the mounting head, the body portion may include a third opening portion in an upper body portion which is formed by division of the division face; the third opening portion may be formed into a tapered shape so as to become smaller gradually toward the downstream side in the suction direction of the gas, and may be configured so that the diameter of one end surface of the third opening portion is larger than the diameter of the other end surface of the third opening portion on the downstream side in the suction direction.

In the mounting head, the body portion may sequentially include, along the suction direction of the gas, the path heater which is disposed directly above the penetration hole penetrating through the bonding heater in the suction path and heats the gas to the temperature higher than the condensation temperature of the gas, the storage portion which is disposed on the downstream side of the first bending portion in the suction path in the suction direction of the gas and stores the droplets formed by condensation of the gas or the solid formed by solidification of the droplets, and the cooling portion which is disposed on the downstream side of the first bending portion in the suction path in the suction direction of the gas and cools the gas to the temperature lower than the condensation temperature of the gas.

In the mounting head, the body portion may further include, in the suction path, a projection portion at a position facing the position where a storage portion which stores the droplets formed by condensation of the gas or a solid formed by solidification of the droplets is arranged.

In the mounting head, the bonding heater and the body portion may include materials having different thermal conductivities.

Effect

According to the present invention, fouling of a mounting head can be inhibited.

DESCRIPTION OF THE EMBODIMENTS

An embodiment of the present invention is described below with reference to drawings. However, the embodiment described below is only illustrative, and there is no intention to exclude various alterations or technique applications unspecified below. That is, various alterations can be made to implement the present invention without departing from the scope of spirit thereof. In addition, in the description of a series of drawings, identical or similar portions are denoted by identical or similar symbols.

Figure 1:
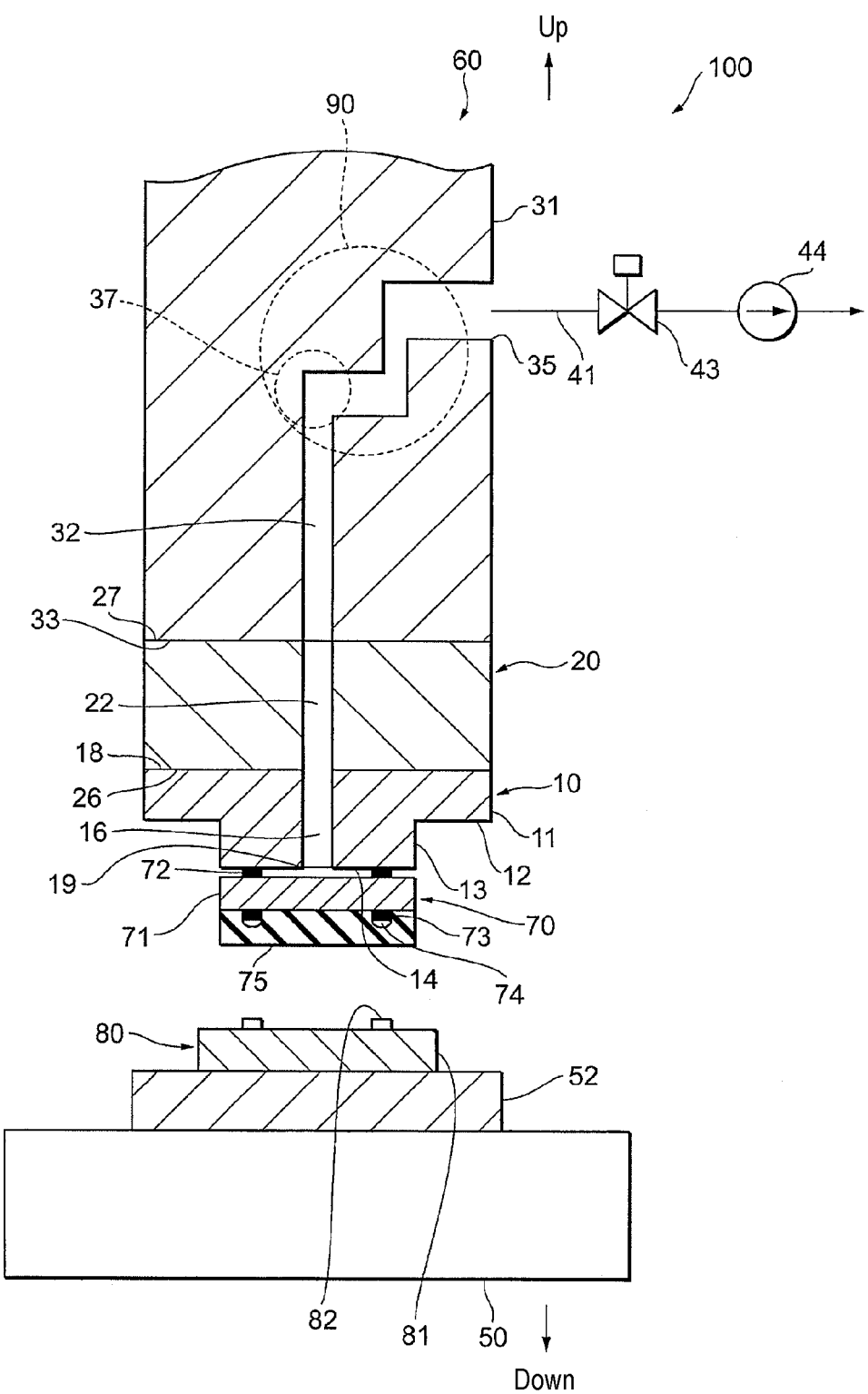
FIG. 1 is a configuration diagram showing a configuration of a flip-chip bonding apparatus of an embodiment of the present invention.

A flip-chip bonding apparatus (an electronic component mounting apparatus) of the embodiment of the present invention is described with reference to FIG. 1 to FIG. 4. FIG. 1 is a configuration diagram showing a configuration of the flip-chip bonding apparatus of the embodiment of the present invention. As shown in FIG. 1, a flip-chip bonding apparatus 100 illustratively includes a bonding stage 50 which attaches and fixes at least one of a semiconductor die 80 and a substrate 52 to an upper surface, and a mounting head 60 which is driven by a driving apparatus not shown in a perpendicular direction (a vertical direction shown in FIG. 1) or a horizontal direction with respect to the bonding stage 50.

The mounting head 60 illustratively includes: an attachment 10, which has a surface 14 (an attachment surface) for attaching a semiconductor die 70 by vacuum; a bonding heater 20, which is disposed on an upper surface 18 on the opposite side of the surface 14 of the attachment 10 and heats the attachment 10 and the semiconductor die 70 attached to the surface 14; a body portion 31 which holds the bonding heater 20 on a lower surface 33 (an end surface); a first opening portion 19 which is formed on the surface 14 of the attachment 10; a second opening portion 35, which is formed on a surface different from the lower surface 33 of the body portion 31; a suction path, which has a first bending portion 37 for bending a flowing path of the gas suctioned from the first opening portion 19 in the body portion 31 and is used as a penetration hole penetrating through the inside of the attachment 10, the bonding heater 20, and the body portion 31, and which discharges the gas suctioned from the first opening portion 19 to the outside in the second opening portion 35 (for example, a suction path including a vacuum suction hole 16 formed in the attachment 10, a vacuum suction hole 22 formed in the bonding heater 20, and a vacuum suction path 32 formed in the body portion 31); and a dripping prevention portion 90, which is formed in the suction path and inhibits droplets formed by condensation of gas from dripping to the bonding heater 20. The body portion 31 is connected to a driving apparatus not shown.

Figure 2A:
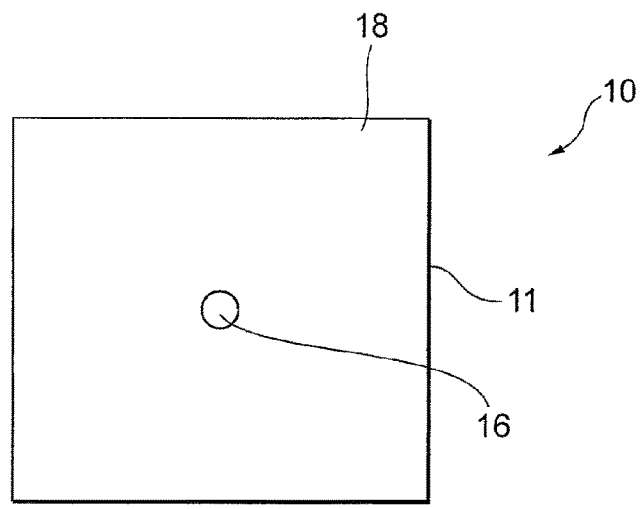
FIG. 2A is a top view of an attachment used in the flip-chip bonding apparatus of the embodiment of the present invention.
Figure 2B:
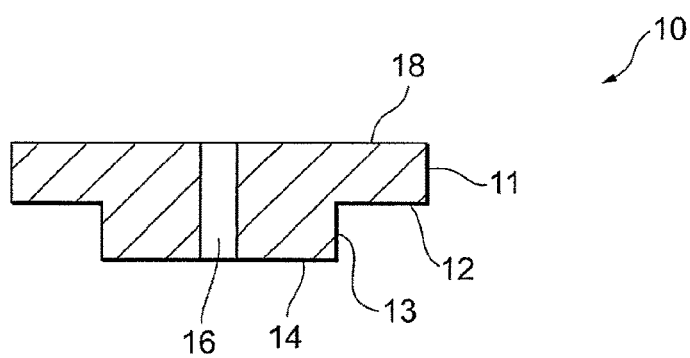
FIG. 2B is a cross-section view of the attachment used in the flip-chip bonding apparatus of the embodiment of the present invention.
Figure 2C:
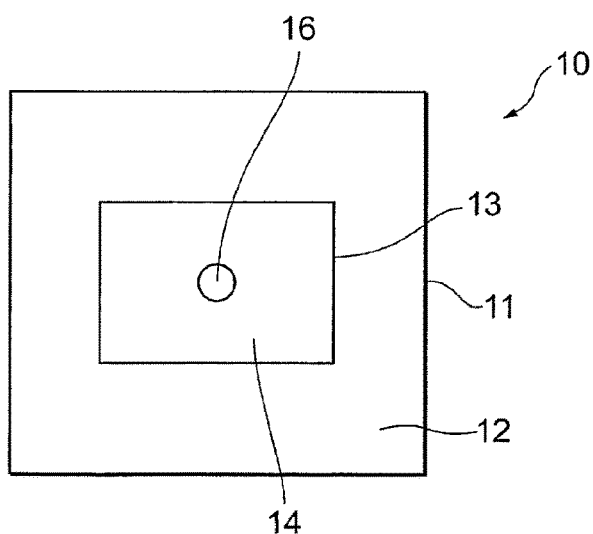
FIG. 2C is a bottom view of the attachment used in the flip-chip bonding apparatus of the embodiment of the present invention.

FIG. 2A is a top view of the attachment used in the flip-chip bonding apparatus of the embodiment of the present invention. FIG. 2B is a cross-section view of the attachment used in the flip-chip bonding apparatus of the embodiment of the present invention. FIG. 2C is a bottom view of the attachment used in the flip-chip bonding apparatus of the embodiment of the present invention. As shown in FIGS. 2A-2C, the attachment 10 illustratively includes a square-plate-shaped base 11, and an island 13 which protrudes in a square pedestal shape from the lower surface 12 of the base 11 and attaches the semiconductor die 70 shown in FIG. 1 to the surface 14 by vacuum. At a center of the attachment 10, the vacuum suction hole 16 for attaching the semiconductor die 70 by vacuum is arranged to penetrate through the base 11 and the island 13.

Back to FIG. 1, the bonding heater 20 is, for example, a square-plate-shaped member in which a heat resistor configured by platinum or tungsten and the like is embedded in ceramics such as aluminum nitride. The size of the bonding heater 20 is approximately the same as the size of the attachment 10. Besides, the thermal conductivity of the bonding heater 20 containing ceramics is, for example, 100 W/m·K or higher.

Figure 3A:
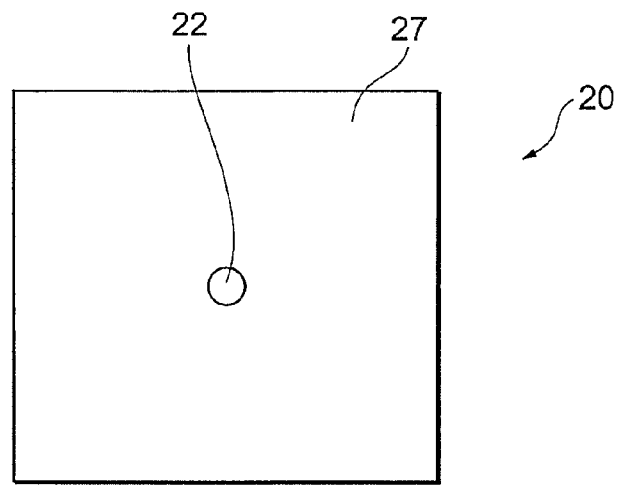
FIG. 3A is a top view of a bonding heater used in the flip-chip bonding apparatus of the embodiment of the present invention.
Figure 3B:
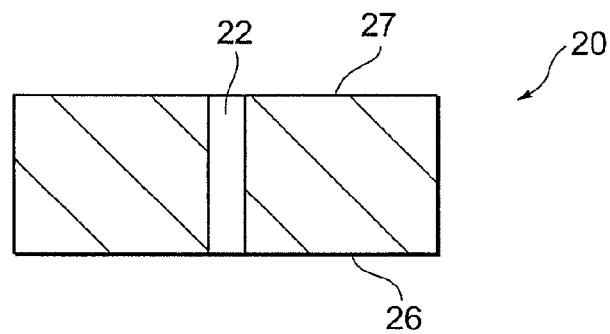
FIG. 3B is a cross-section view of the bonding heater used in the flip-chip bonding apparatus of the embodiment of the present invention.
Figure 3C:
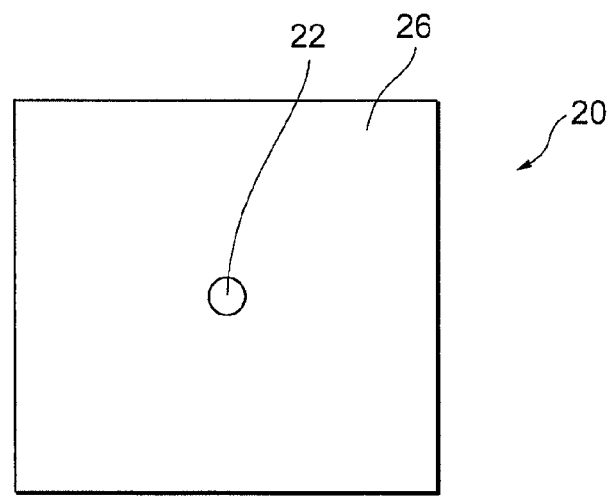
FIG. 3C is a bottom view of the bonding heater used in the flip-chip bonding apparatus of the embodiment of the present invention.

FIG. 3A is a top view of the bonding heater used in the flip-chip bonding apparatus of the embodiment of the present invention. FIG. 3B is a cross-section view of the bonding heater used in the flip-chip bonding apparatus of the embodiment of the present invention. FIG. 3C is a bottom view of the bonding heater used in the flip-chip bonding apparatus of the embodiment of the present invention. As shown in FIGS. 3A-3C, at a center of the bonding heater 20, the vacuum suction hole 22 in communication with the vacuum suction hole 16 of the attachment 10 is arranged. In addition, as shown in FIG. 1 and FIG. 3B, an upper surface 27 of the bonding heater 20 is in contact with the lower surface 33 of the body portion 31.

Back to FIG. 1, the body portion 31 is, for example, a member which includes stainless steel containing iron or chromium and the like. The thermal conductivity of the body portion 31 containing stainless and the like is, for example, dozens of Watts per meter-Kelvin (W/m·K) or lower, smaller than the thermal conductivity of the bonding heater 20. In other words, the body portion 31 and the bonding heater 20 comprise materials having different thermal conductivities.

The vacuum suction path 32 arranged in the body portion 31 is connected via the second opening portion 35 to a vacuum pump 44 by a pipe 41 which is equipped with a solenoid valve 43 in the middle. When the vacuum pump 44 is driven, the vacuum suction path 32 to which the pipe 41 is connected and the vacuum suction hole 22 of the bonding heater 20 are in a vacuum state, and the attachment 10 is attached in vacuum to a lower surface 26 of the bonding heater 20. In addition, when the solenoid valve 43 is open, the vacuum suction path 32 of the body portion 31 to which the pipe 41 is connected, the vacuum suction hole 22 of the bonding heater 20 in communication with the vacuum suction path 32, and the vacuum suction hole 16 of the attachment 10 in communication with the vacuum suction hole 22 are in a vacuum state. Thus, a surface of the semiconductor die 70 on a protruding electrode 72 side is attached in vacuum to the surface 14 of the island 13 of the attachment 10.

Figure 4:
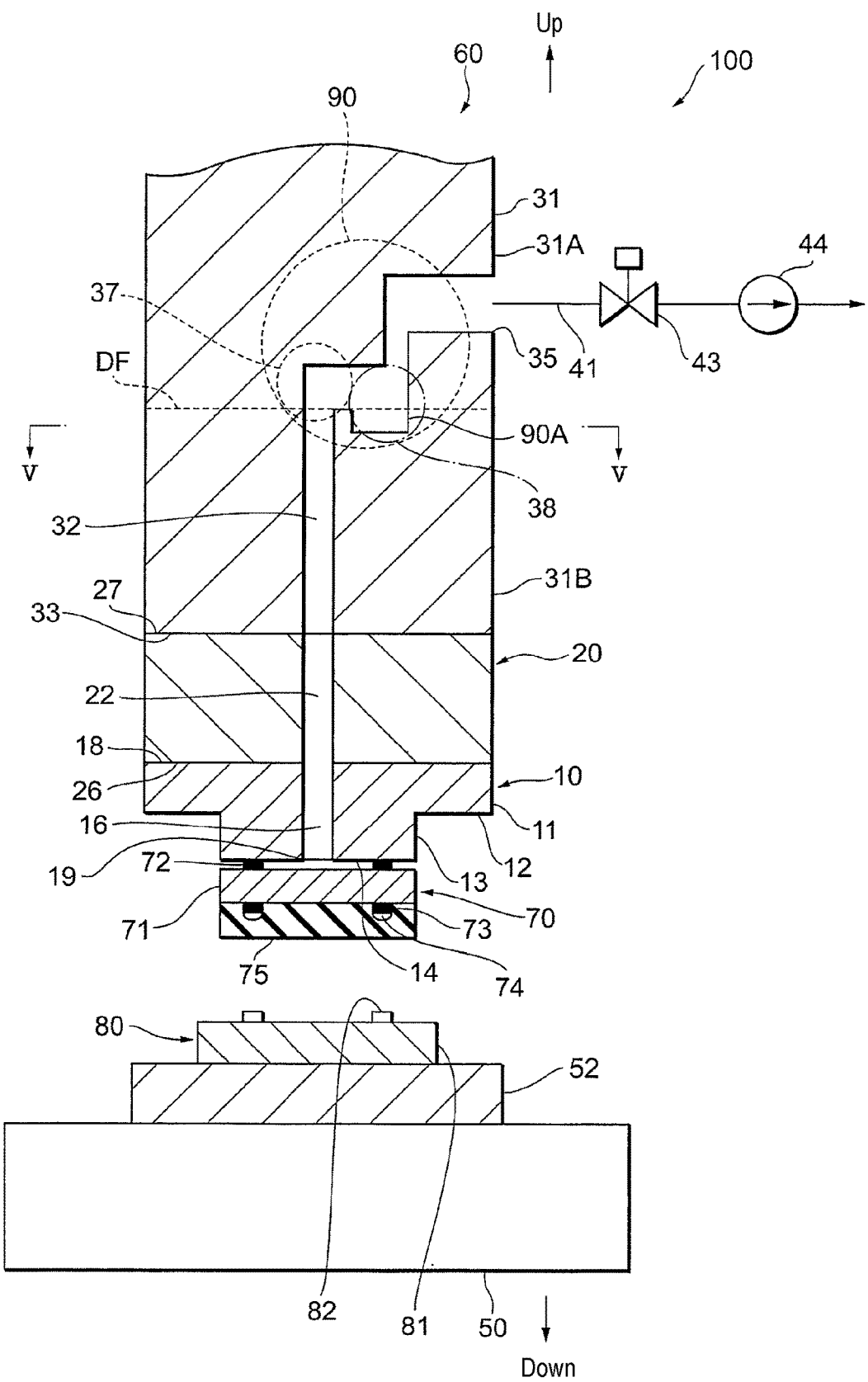
FIG. 4 is a configuration diagram showing a configuration of another flip-chip bonding apparatus of the embodiment of the present invention.

FIG. 4 is a configuration diagram showing a configuration of another flip-chip bonding apparatus of the embodiment of the present invention. As shown in FIG. 4, the dripping prevention portion 90 of the mounting head 60 includes a storage portion 90A, which is disposed on a downstream side of the first bending portion 37 in the vacuum suction path 32 (the suction path) in a suction direction of the gas and stores droplets formed by condensation of the gas or a solid formed by solidification of the droplets. The vacuum suction path 32 further includes a second bending portion 38 arranged on the downstream side of the first bending portion 37 in the suction direction of the gas, and the dripping prevention portion 90 is arranged over the first bending portion 37 and the second bending portion 38. The storage portion 90A may be configured to be disposed in the second bending portion 38. In addition, the body portion 31 may be configured to be divisible into upper and lower in a division face DF passing through the storage portion 90A. Here, an upper portion of the body portion 31 formed by the division of the division face DF is set as an upper body portion 31A, and a lower portion is set as a lower body portion 31B.

Figure 5:
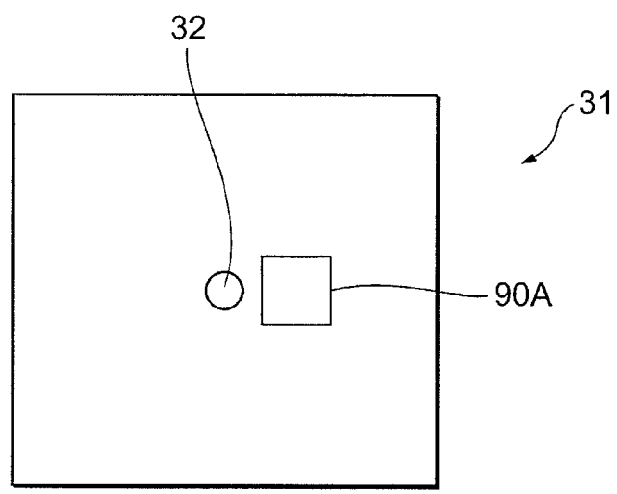
FIG. 5 is a cross-section view observed from a direction V-V of FIG. 4.

FIG. 5 is a cross-section view of the body portion 31 observed from a direction V-V of FIG. 4. As shown in FIG. 4 and FIG. 5, the storage portion 90A is disposed at a position different from the positions of the vacuum suction holes 16, 22 in a cross-section view of the body portion 31 orthogonal to an axial direction of the vacuum suction holes 16, 22. Here, the storage portion 90A is configured in a three-dimensional shape. In addition, the vacuum suction path 32 arranged in the body portion 31 is configured in communication with the vacuum suction hole 22, which is arranged in the bonding heater 20 and in communication with the vacuum suction hole 16 of the attachment 10.

Figure 6:
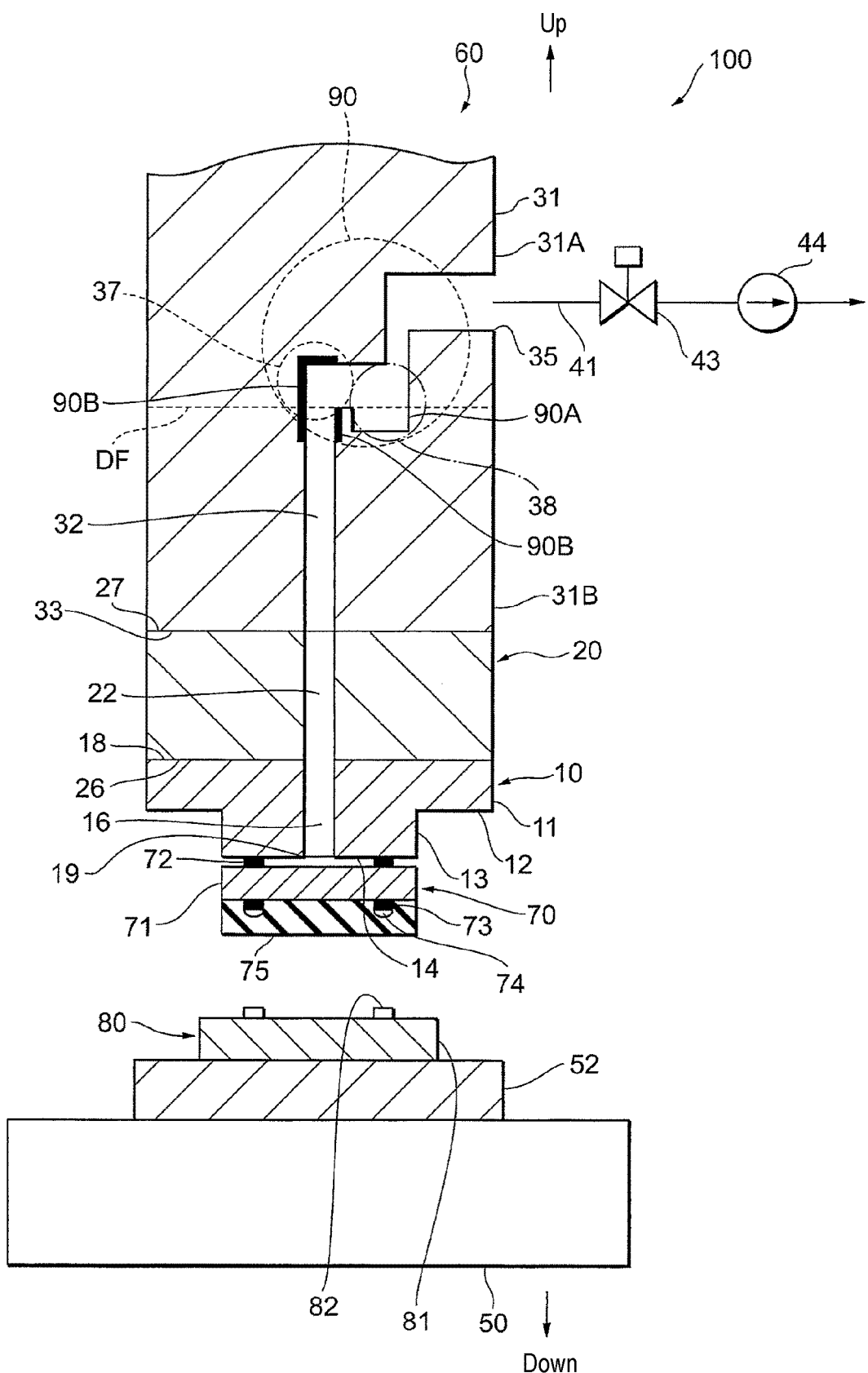
FIG. 6 is a configuration diagram showing the configuration of another flip-chip bonding apparatus of the embodiment of the present invention.

FIG. 6 is a configuration diagram showing the configuration of another flip-chip bonding apparatus of the embodiment of the present invention. As shown in FIG. 6, the dripping prevention portion 90 includes a path heater 90B, which is disposed in the first bending portion 37 directly above the vacuum suction hole 22 (the penetration hole) that is used as a penetration hole penetrating the bonding heater 20 in the vacuum suction path 32 (the suction path), and which heats the gas to a temperature higher than the condensation temperature of the gas. The path heater 90B heats the gas to the temperature higher than the condensation temperature of the gas in the first bending portion 37, and thus liquefaction of the gas around the first bending portion 37 can be prevented.

Figure 7:
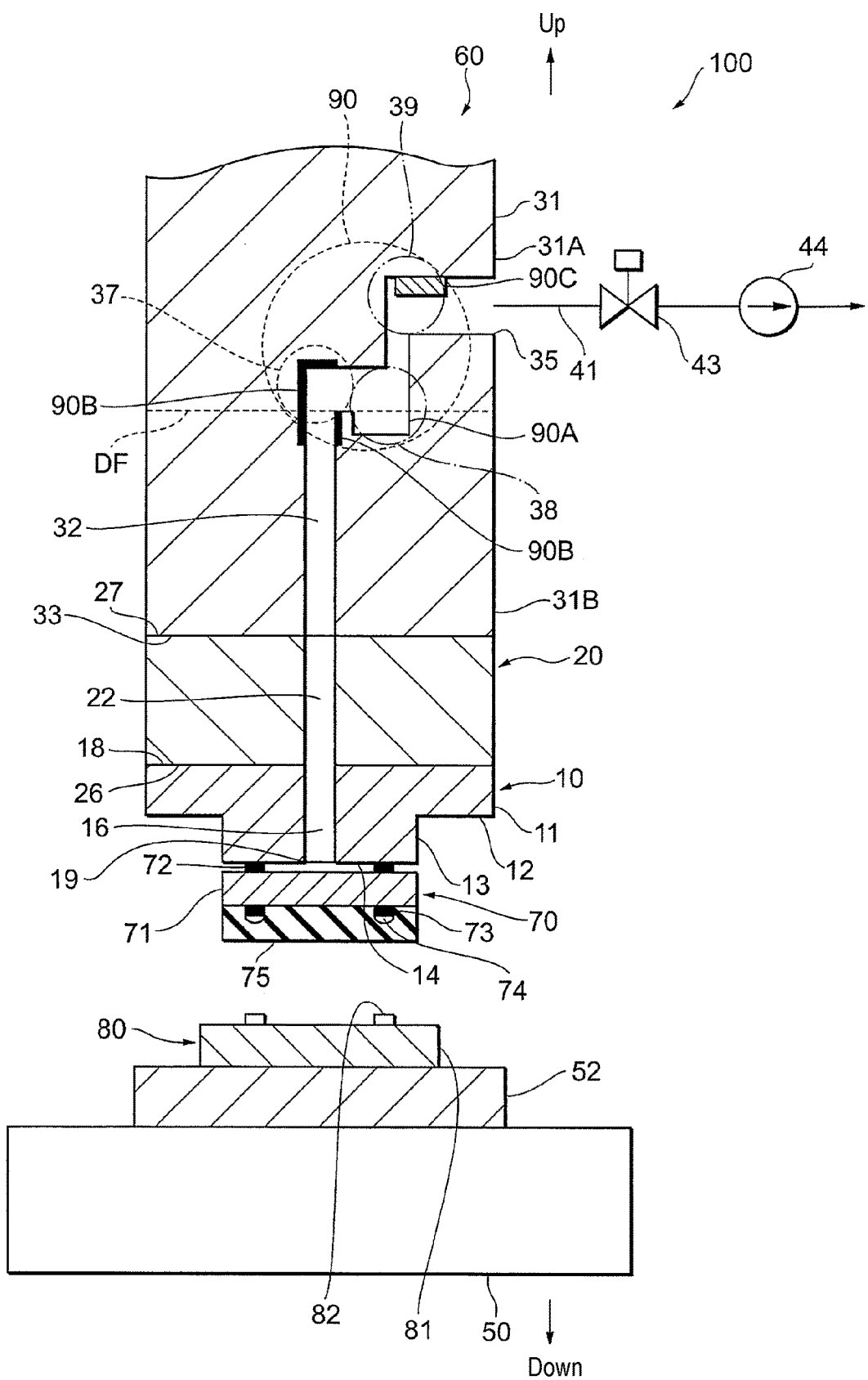
FIG. 7 is a configuration diagram showing the configuration of another flip-chip bonding apparatus of the embodiment of the present invention.

In FIG. 7, the dripping prevention portion 90 includes a cooling portion 90C, which is disposed on the downstream side of the first bending portion 37 in the vacuum suction path 32 (the suction path) in the suction direction of the gas and cools the gas to a temperature lower than the condensation temperature of the gas. The vacuum suction path 32 further includes a third bending portion 39, which is arranged on the downstream side of the second bending portion 38 in the suction direction of the gas, and the dripping prevention portion 90 is arranged over the first bending portion 37, the second bending portion 38, and the third bending portion 39. The cooling portion 90C may be configured to be disposed in the third bending portion 39. As shown in FIG. 7, the body portion 31 sequentially includes the path heater 90B, the storage portion 90A, and the cooling portion 90C along the suction direction of the gas.

Besides, the dripping prevention portion 90 may include, in place of the cooling portion 90C, a condensation portion which is disposed on the downstream side of the first bending portion 37 in the vacuum suction path 32 in the suction direction of the gas and increases fluid resistance of the gas. In addition, the dripping prevention portion 90 may further include the condensation portion in addition to the cooling portion 90C. The cooling portion 90C and the condensation portion can promote condensation of the gas, and the liquefied gas is stored in the storage portion 90A.

Figure 8:
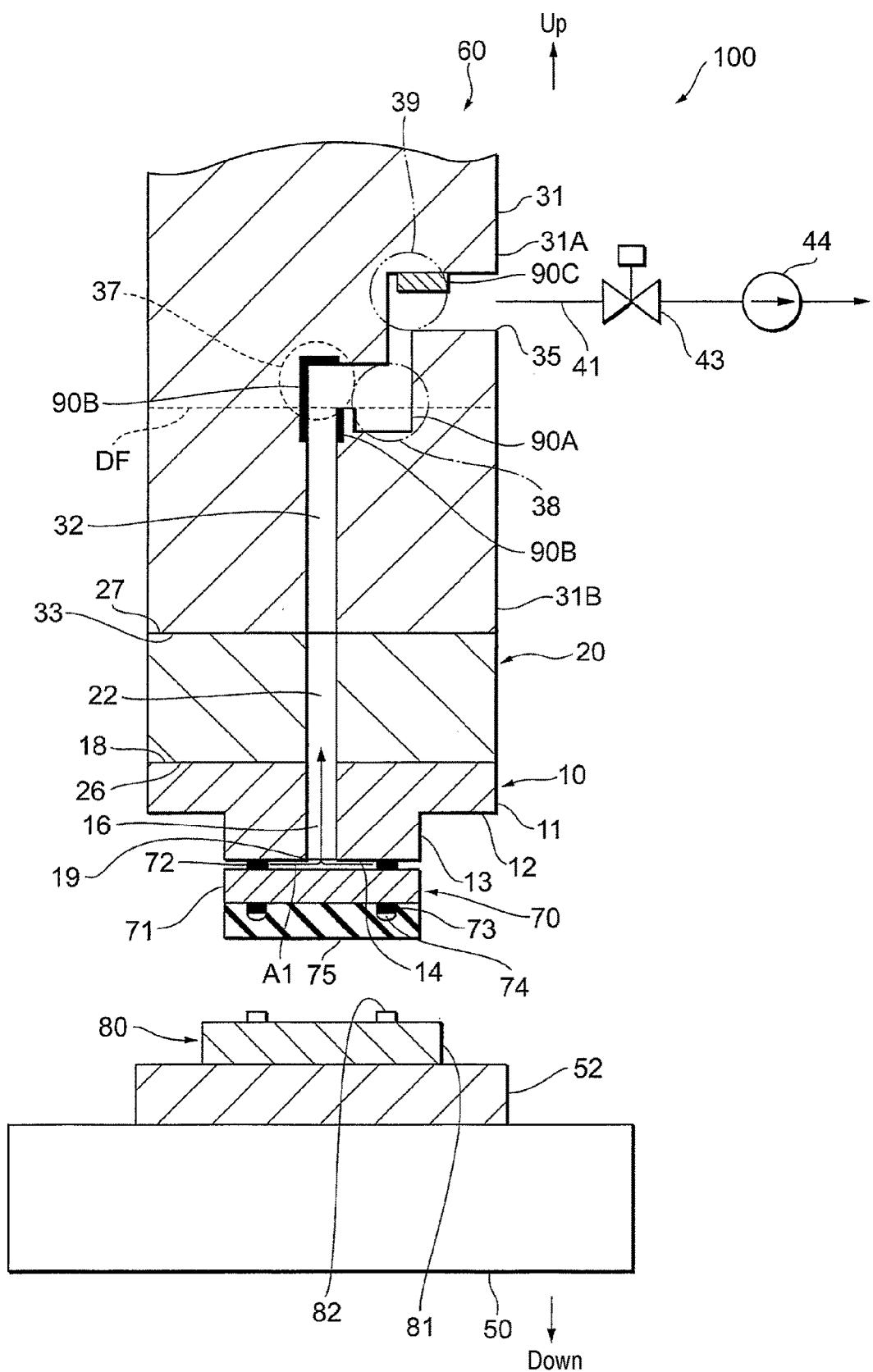
FIG. 8 is an illustration diagram showing a state that a second-stage semiconductor die is attached to the attachment in a process flow for using the flip-chip bonding apparatus of the embodiment of the present invention to perform a stack mounting on a semiconductor die which is equipped with electrodes on two surfaces.
Figure 9:
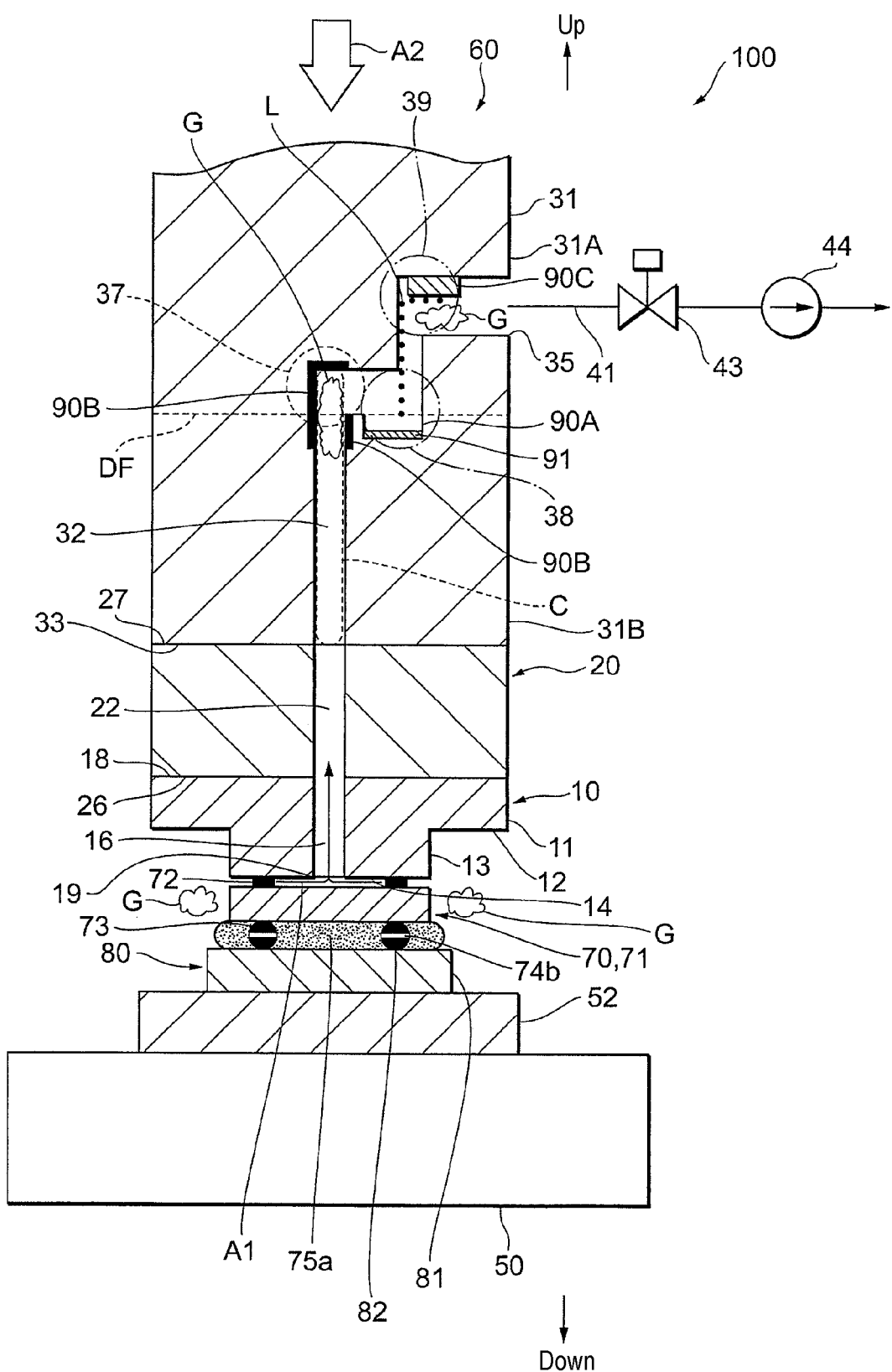
FIG. 9 is an illustration diagram showing a state that the attachment is lowered to press electrodes of the second-stage semiconductor die to electrodes of a first-stage semiconductor die and the second-stage semiconductor die is heated by the bonding heater after the process flow shown in FIG. 8.
Figure 10:
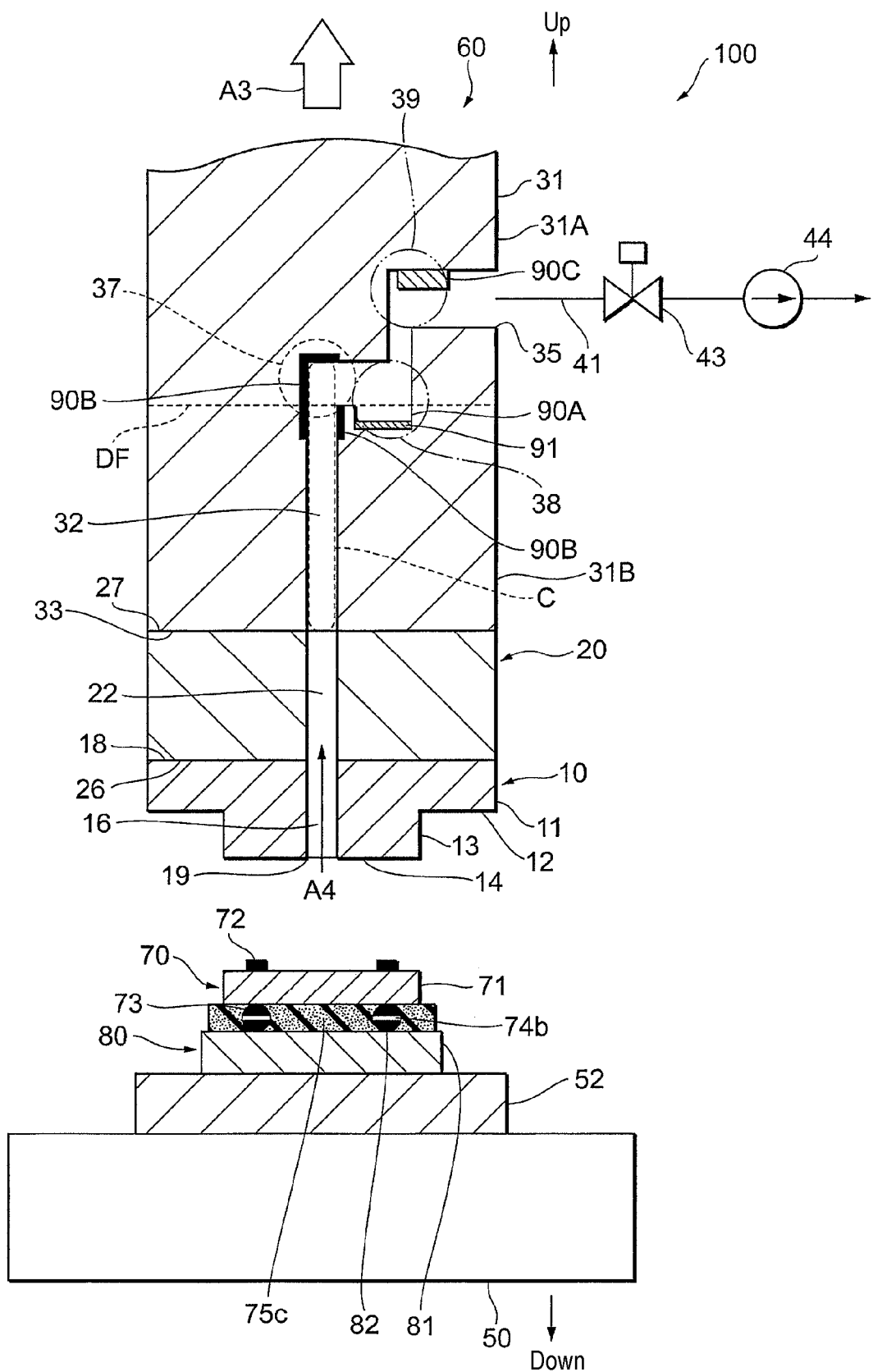
FIG. 10 is an illustration diagram showing a state that the attachment is raised after the process flow shown in FIG. 9.

With reference to FIG. 8 to FIG. 10, a process flow is described, in which by the flip-chip bonding apparatus 100 of this embodiment, a second-stage semiconductor die 70, in which protruding electrodes 72 are formed on one surface of a die body 71, protruding electrodes 73 are formed on the other surface of the die body 71, bumps 74 are further formed by a solder and the like at leading ends of the protruding electrodes 73, and a NCF 75 is pasted on the other surface equipped with the protruding electrodes 73, is mounted on a first-stage semiconductor die 80 in which protruding electrodes 82 are formed on the upper surface of the die body 81. Besides, the protruding electrodes 72, 73 may be configured by copper and the like for example.

FIG. 8 is an illustration diagram showing a state that the second-stage semiconductor die 70 is attached to the attachment 10 in a process flow for using the flip-chip bonding apparatus 100 of the embodiment of the present invention to perform a stack mounting on the semiconductor die 70 which is equipped with electrodes on two surfaces. As shown in FIG. 8, the first-stage semiconductor die 80 is disposed on the upper surface of the bonding stage 50. In addition, the vacuum pump 44 shown in FIG. 1 is driven so that the vacuum suction path 32 to which the pipe 41 is connected and the vacuum suction hole 22 of the bonding heater 20 are set in a vacuum state, and the upper surface 18 of the attachment 10 are attached in vacuum to the lower surface 26 of the bonding heater 20.

Next, the mounting head 60 is moved onto the semiconductor die 70 which is placed on an unillustrated inversion and delivery apparatus of the semiconductor 70 in a manner that the protruding electrodes 72 are on the upper side. Then, the solenoid valve 43 is opened, and the vacuum suction path 32 of the body portion 31 to which the pipe 41 is connected, the vacuum suction hole 22 of the bonding heater 20 in communication with the vacuum suction path 32, and the vacuum suction hole 16 of the attachment 10 in communication with the vacuum suction hole 22 are in a vacuum state. Thus, the surface of the semiconductor die 70 on the protruding electrode 72 side is attached in vacuum to the surface 14 of the island 13 of the attachment 10.

After that, when the mounting head 60 is moved in a manner that the position of the semiconductor die 70 fits with the position of the semiconductor die 80 disposed on the bonding stage 50, the flip-chip bonding apparatus 100 is in the state shown in FIG. 8. In this state, the temperature of the attachment 10 is, for example, about 100° C., and the bump 74 is not in a melting state. In addition, the NCF 75 is also not in a low viscosity state.

As shown in FIG. 8, a gap corresponding to merely the height of the protruding electrodes 72 is formed between the surface 14 of the attachment 10 and the die body 71 of the semiconductor die 70. Thus, even in a state that the semiconductor die 70 is attached in vacuum to the surface 14 of the attachment 10, as shown by an arrow A1 shown in FIG. 8, air around the semiconductor die 70 enters the vacuum suction hole 16 from the abovementioned gap.

FIG. 9 is an illustration diagram showing a state that the attachment 10 is lowered to press the electrodes of the semiconductor die 70 to the electrodes of the semiconductor die 80 and the semiconductor die 70 is heated by the bonding heater 20 after the process flow shown in FIG. 8. As shown in FIG. 9, the mounting head 60 is lowered by an unillustrated driving apparatus as shown by a hollow arrow A2, the bumps 74 of the semiconductor die 70 attached to the surface 14 of the attachment 10 are pressed onto the protruding electrodes 82 of the semiconductor die 80 attached in vacuum onto the bonding stage 50, and the semiconductor die 70 is heated to about 250° C. by the bonding heater 20 to melt the bumps 74.

Then, the NCF 75 pasted to a side of the semiconductor die 70 on which the protruding electrodes 73 is disposed is low in viscosity and fills the gap between the die body 81 of the semiconductor die 80 and the die body 71 of the semiconductor die 70. After that, the protruding electrodes 82 of the semiconductor die 80 and the protruding electrodes 73 of the semiconductor die 70 are metallically bonded by the molten bumps 74, and the resin filling the gap between the die body 81 of the semiconductor die 80 and the die body 71 of the semiconductor die 70 is thermally cured to a thermoset resin 75a.

At this time, the gasified components of the NCF 75 become a gas G and remain around the semiconductor die 70. There is a concern that the remaining gas flows, as shown by the arrow A1, into the vacuum suction hole 16 of the attachment 10, the vacuum suction hole 22 of the bonding heater 20, and the vacuum suction path 32 of the body portion 31. However, the gas G flowing into these places is heated, for example, by the path heater 90B arranged in the vacuum suction path 32, and directly rises into the vacuum suction path 32 without liquefying on the way to rise into the vacuum suction path 32 (for example, a range surrounded by a dotted line C in the vacuum suction path 32). The rising gas G is cooled by the cooling portion 90C arranged in the vacuum suction path 32 and thereby liquefies (condenses). Then, droplets L drip from the cooling portion 90C and is stored in the storage portion 90A arranged in the vacuum suction path 32 as a stored article 91, or a solid formed by solidification of the liquid is stored in the storage portion 90A as the stored article 91.

FIG. 10 is an illustration diagram showing a state that the attachment is raised after the process flow shown in FIG. 9. As shown in FIG. 10, when the mounting head 60 is raised by an unillustrated driving apparatus as shown by a hollow arrow A3 after the solenoid valve 43 is closed and the suction of the vacuum suction path 32 is stopped, the semiconductor die 80 and the semiconductor die 70 bonded to the semiconductor die 80 are left on the bonding stage 50. Then, when the temperature is reduced, the molten bump 74 solidifies to a bonding metal 74b, and the thermoset resin 75a is cured to a filling resin 75c which fills the gap between the upper surface of the die body 81 of the semiconductor die 80 and the lower surface of the die body 71 of the semiconductor die 70.

As shown in FIG. 10, even in a state that the semiconductor die 70 is mounted on the semiconductor die 80 and the mounting head 60 is raised, there is also a concern that the gas generated during the process shown in FIG. 9 remains, and the gas flows into the vacuum suction path 32 of the body portion 31 as shown by an arrow A4. However, as already described using FIG. 9, the gas is heated by the path heater 90B arranged in the vacuum suction path 32 and directly rises into the vacuum suction path 32 without liquefying on the way to rise (for example, the range surrounded by the dotted line C in the vacuum suction path 32). The rising gas is cooled by the cooling portion 90C arranged in the vacuum suction path 32 and thereby liquefies (condenses). Then, the condensed liquid is stored in the storage portion 90A arranged in the vacuum suction path 32 as the stored article 91, or a solid formed by solidification of the liquid is stored in the storage portion 90A as the stored article 91.

Figure 11:
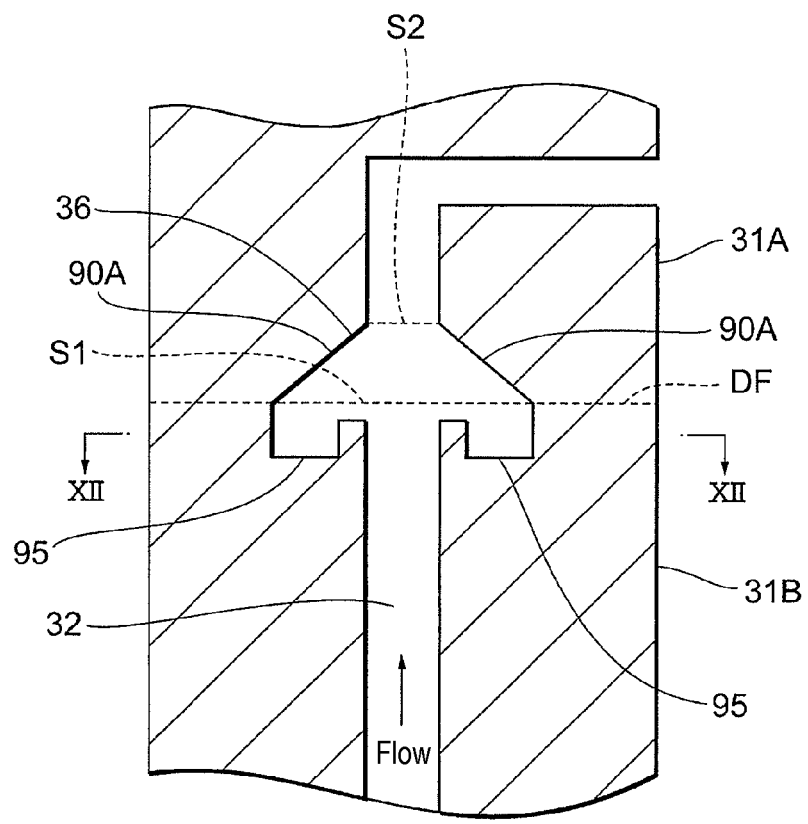
FIG. 11 is a configuration diagram showing an example configuration of a body portion used in the flip-chip bonding apparatus of the embodiment of the present invention.

FIG. 11 is a configuration diagram showing another example configuration of the body portion used in the flip-chip bonding apparatus of the embodiment of the present invention. As shown in FIG. 11, the body portion 31 is configured to be divisible into upper and lower in the division face DF passing through the storage portion 90A. In the body portion 31, the bottom 95 of the storage portion 90A is arranged in a lower body portion 31B formed by division of the division face DF. In addition, the body portion 31 includes a third opening portion 36 of the storage portion 90A in an upper body portion 31A formed by division of the division face DF. The third opening portion 36 is formed into a tapered shape so as to become smaller gradually toward the downstream side in the suction direction of the gas, and is configured so that the diameter of one end surface S1 of the third opening portion 36 is larger than the diameter of the other end surface S2 of the third opening portion 36 on the downstream side in the suction direction.

Figure 12:
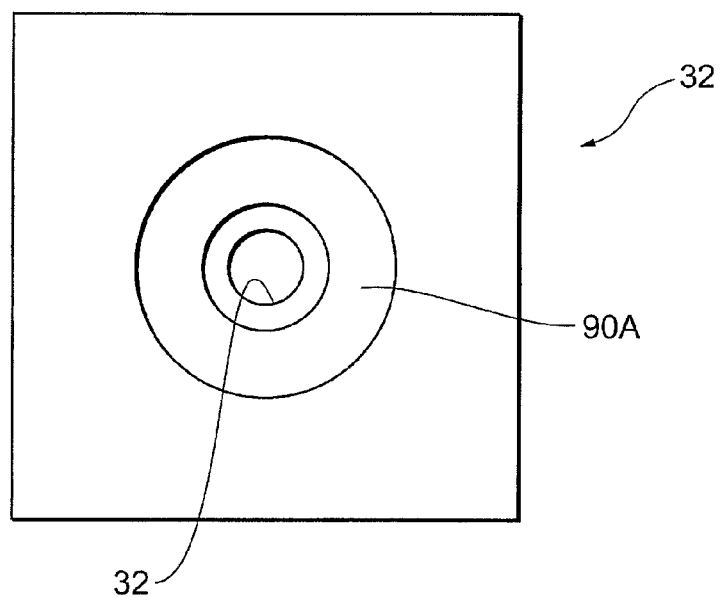
FIG. 12 a cross-section view observed from a direction XII-XII of FIG. 11.

FIG. 12 is a cross-section view of the body portion observed from a direction XII-XII. As shown in FIG. 11 and FIG. 12, the storage portion 90A is disposed along an outer periphery of the vacuum suction path 32. In such a storage portion 90A, the liquid formed by condensation of gas faces the bottom 95 along a wall surface of the storage portion 90A, and thus a foreign matter can be appropriately stored at a position different from the positions of the vacuum suction holes 16, 22 in the cross-section view of the body portion 31 orthogonal to the axial direction of the vacuum suction holes 16, 22 shown in FIG. 10.

Figure 13:
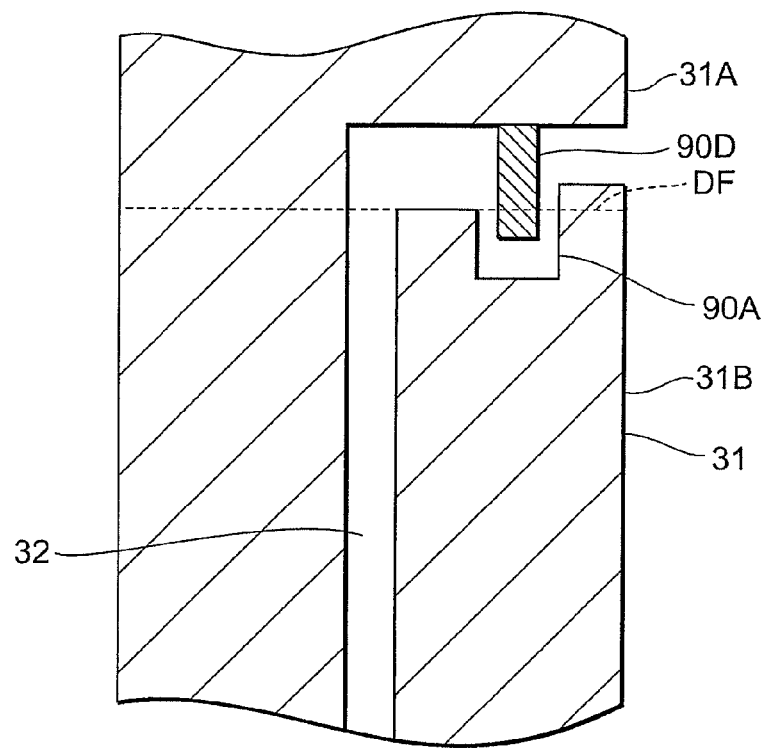
FIG. 13 is a configuration diagram showing an example configuration of the body portion used in the flip-chip bonding apparatus of the embodiment of the present invention.

FIG. 13 is a configuration diagram showing another example configuration of the body portion used in the flip-chip bonding apparatus of the embodiment of the present invention. As shown in FIG. 13, the body portion 31 may be configured to include a projection portion 90D at a position facing the position where the storage portion 90A is arranged in the vacuum suction path 32. In this way, by lengthening a length of the vicinity where the storage portion 90A is arranged in the vacuum suction path 32, the gas can be cooled naturally. Therefore, since the cooling portion 90C as shown in FIG. 7 to FIG. 10 is unnecessary, the body portion 31 can be easily manufactured, and manufacturing cost of the body portion 31 can be reduced.

As described above, the vacuum suction path 32 arranged in the body portion 31 includes the dripping prevention portion 90. Thus, even if the gas flowing into the vacuum suction path 32 condenses, a liquid and a solid formed by solidification of the liquid can be prevented from dripping to the bonding heater 20. Therefore, the resin containing the gas components can be prevented from sealing the vacuum suction hole 22, and thus fouling of the mounting head 60 can be inhibited.

Other Embodiments

The present invention is described above according to the embodiment, but the description and the drawings that constitute a part of this disclosure should not be construed as limiting this invention. Alternative embodiments, examples and application techniques should be apparent to those skilled in the art from this disclosure.

In the above-described embodiment, the vacuum suction holes 16, 22 and the vacuum suction path 32 are described as an elongated round shape, but the shape of the vacuum suction hole is not limited hereto and the vacuum suction hole may be configured, for example, by a rectangular hole or an elliptical hole.

In addition, an example in which the NCF 75 is used in the bonding between the semiconductor die 70 and the semiconductor die 80 is described, but the present invention is not limited hereto, and other types of resins can also be used.

What is claimed is:

1. A mounting head, which is used in an electronic component mounting apparatus that bonds electrodes of a semiconductor die and a substrate or electrodes of another semiconductor die, the mounting head comprising:
an attachment, which has an attachment surface for attaching the semiconductor die;
a bonding heater, which is disposed on a surface of the attachment opposite to the attachment surface and heats the attachment and the semiconductor die;
a body portion, which holds the bonding heater on an end surface;
a first opening portion, which is formed on the attachment surface of the attachment;
a second opening portion, which is formed on a surface different from the end surface of the body portion;
a suction path, which has a first bending portion configured to bend a flowing path of a gas in the body portion that is suctioned from the first opening portion, and the suction path penetrating through the inside of the attachment, the bonding heater, and the body portion, and the suction path is configured to discharge the gas suctioned from the first opening portion to the outside in the second opening portion; and
a dripping prevention portion, which is formed in the suction path and configured to inhibit droplets formed by condensation of the gas from dripping to the bonding heater,
wherein the dripping prevention portion comprises a storage portion, which is disposed on a downstream side of the first bending portion in the suction path in a suction direction of the gas and is configured to store the droplets formed by condensation of the gas or a solid formed by solidification of the droplets,
wherein the storage portion includes a recess that is recessed from the suction path.

2. The mounting head according to claim 1,
wherein the dripping prevention portion comprises a path heater, which is disposed directly above a penetration hole penetrating through the bonding heater in the suction path and heats the gas to a temperature higher than a condensation temperature of the gas.

3. The mounting head according to claim 1,
wherein the dripping prevention portion comprises a cooling portion, which is disposed on a downstream side of the first bending portion in the suction path in a suction direction of the gas and cools the gas to a temperature lower than a condensation temperature of the gas.

4. The mounting head according to claim 1,
wherein the dripping prevention portion comprises a condensation portion, which is disposed on a downstream side of the first bending portion in the suction path in a suction direction of the gas and increases fluid resistance of the gas.

5. The mounting head according to claim 1,
wherein the suction path further comprises a second bending portion, which is arranged on a downstream side of the first bending portion in a suction direction of the gas; and
the dripping prevention portion is arranged at the first bending portion and the second bending portion.

6. The mounting head according to claim 5,
wherein the storage portion which stores the droplets formed by condensation of the gas or a solid formed by solidification of the droplets is disposed in the second bending portion.

7. The mounting head according to claim 1,
wherein the body portion is configured to be divisible into an upper portion and a lower portion by a division face passing through the storage portion configured to store the droplets formed by condensation of the gas or a solid formed by solidification of the droplets.

8. The mounting head according to claim 7,
wherein a bottom of the storage portion is arranged in a lower body portion which is formed by division of the division face.

9. The mounting head according to claim 7,
wherein the body portion comprises a third opening portion in an upper body portion which is formed by division of the division face; and
the third opening portion is formed into a tapered shape so as to become smaller gradually toward the downstream side in a suction direction of the gas, and the diameter of one end surface of the third opening portion is larger than the diameter of the other end surface of the third opening portion on the downstream side in the suction direction.

10. The mounting head according to claim 1,
wherein the body portion sequentially comprises, along a suction direction of the gas, a path heater which is disposed directly above a penetration hole penetrating through the bonding heater in the suction path and heats the gas to a temperature higher than a condensation temperature of the gas, a storage portion which is disposed on a downstream side of the first bending portion in the suction path in the suction direction of the gas and stores droplets formed by condensation of the gas or a solid formed by solidification of the droplets, and a cooling portion which is disposed on the downstream side of the first bending portion in the suction path in the suction direction of the gas and cools the gas to a temperature lower than the condensation temperature of the gas.

11. The mounting head according to claim 1, wherein the body portion further comprises, in the suction path, a projection portion facing a storage portion which stores droplets formed by condensation of the gas or a solid formed by solidification of the droplets is arranged.

12. The mounting head according to claim 1, wherein the bonding heater and the body portion comprises materials having different thermal conductivities.

* * * * *